BREAKDOWN VOLTAGE AS A FUNCTION OF RESISTIVITY OF N TYPE SILICON COMPARING JUNCTIONS HAVING NEAR NORMAL SURFACE ANGLES WITH JUNCTIONS HAVING HIGHLY ACUTE SURFACE ANGLES.

INVENTOR.
O. Melville Clark
BY Mueller & Aichele
ATT'YS.

Aug. 13, 1968 O. M. CLARK 3,397,349

HIGH VOLTAGE SEMICONDUCTOR RECTIFIER WITH A SLOPING SURFACE ACROSS BARRIER EDGE

Original Filed Feb. 17, 1961 2 Sheets-Sheet 2

INVENTOR.
O. Melville Clark
BY Mueller & Aichele
ATT'YS.

3,397,349

HIGH VOLTAGE SEMICONDUCTOR RECTIFIER WITH A SLOPING SURFACE ACROSS BARRIER EDGE

Oscar Mellville Clark, Scottsdale, Ariz., assignor to Motorola, Inc., Franklin Park, Ill., a corporation of Illinois Original application Feb. 17, 1961, Ser. No. 90,026. Divided and this application Dec. 22, 1964, Ser. No. 420,409
16 Claims. (Cl. 317—234)

ABSTRACT OF THE DISCLOSURE

A semiconductor rectifier has a sloping surface around the edge in which the pn-junction terminates. The magnitude of the slope decreases continually in the direction away from the region with the smaller diameter and this region has a higher resistivity than the other.

This application is a division of application Ser. No. 90,026, filed Feb. 17, 1961 and now abandoned.

This invention relates to a particular construction for semiconductor dice which are the fundamental electrical elements in semiconductor rectifier devices. In particular, the invention relates to a diffused junction type rectifying element of a construction and configuration which enhances the voltage breakdown characteristics of the element.

At the time of filing the above-noted parent application there was a need for a small, lightweight, rugged component which could perform a high voltage rectification function in electronic equipment. The present invention has filled that need. Examples of special purpose equipments in which such components are useful are compact military type transmitters, portable television sets, photoflash units and scintillation counters. Such a high voltage element can be used in any equipment where there is a requirement to rectify alternating voltages of over 1000 volts, such as radar equipment, X-ray equipment and static electricity type pollen and dust precipitators.

In order to provide the high voltage breakdowns required for a component such as this prior to the present invention, it was necessary generally to use in the component a number of semiconductor dice connected in series, since the over-all high voltage reverse breakdown value of the component is the sum of the breakdown values of the individual dice. The use of multiple dice increases costs, complicates the assembly procedures and makes it more difficult to conduct heat from the die assemblies. Also, the use of multiple dice causes a considerably greater amount of heat to be generated within the package because the heat generated is directly proportional to the number of dice used. It is desirable therefore, to attain the necessary voltage breakdown value with a smaller number of dice in series or with a single die.

An object of the invention is to provide semiconductor rectifying elements having unusually high reverse breakdown values which can be fabricated economically and are suitable for use in mass produced semiconductor devices.

Another object of the invention is to provide a high voltage rectifying element which dissipates a minimum amount of power.

Another object is to provide a high voltage rectifying semiconductor device which has the minimum possible number of die elements thereby simplifying the structure and reducing material and assembly costs.

Another object of the invention is to provide a high voltage rectifying element which readily transfers heat generated within it to a heat sink.

A feature of the invention is the attainment of unusually high reverse breakdown voltages in a single semiconductor die element by the use of a novel die configuration in which the peripheral die surface intersects the plane of the junction at a highly acute angle which may be considerably less than 50°, thereby decreasing the voltage gradient which is produced along the surface of the die at and near the junction in the operation of the die in a rectifier device. The attainment of very high breakdown voltages in a single die is of importance because it increases the number of applications in which a component having a single die can be used, and also because it reduces the number of dice required for applications in which a single die cannot be used.

Another feature of the invention is a method of fabricating semiconductor dice having the configuration discussed above by an etching operation which cuts a large number of dice out of a wafer of semiconductor material and at the same time inherently shapes the dice so that they have a peripheral surface of changing slope with the least slope occurring at the junction area, thereby maximizing the voltage breakdown characteristics of the dice.

Referring now to the drawings.

A semiconductor rectifying die in accordance with the invention is shaped somewhat like a truncated cone whose peripheral surface has a varying slope. An important characteristic of the shape is that at the point on the peripheral surface where the rectifying junction is exposed, there is an acute angle between the plane of the junction and the peripheral surface. It has been found that a rectifying element having this shape exhibits considerably higher reverse breakdown voltage characteristics than one in which the junction is more or less perpendicular to the peripheral surface of the die.

The shaping of the die surface is accomplished in the step of etching a wafer so as to divide it into a number of dice by controlling the etching process so that it produces a tapering peripheral surface on the dice. Specifically, the side of the wafer which is closest to the rectifying junction is masked with wax or other suitable resist material which completely covers that surface and prevents any etching action from occurring at that surface. The side of the wafer which is farther away from the rectifying junction is masked in a pattern such that the masking material covers only those portions of the wafer which will be dice after the etching, and leaves exposed regions between the dice areas which are to be etched away.

The resulting masked wafer is immersed in an etching solution for a period of time sufficient for the solution to etch completely through the wafer at the exposed regions, thus dividing the wafer into dice. The main significance of this method is that because the etching action begins at the side of the wafer away from the junction and progresses completely through the wafer from that side, the peripheral die surfaces become increasingly tapered as the etching progresses. Thus, the taper is greatest at the side of the die closest to the junction, and this causes the junction to have favorably high breakdown voltage characteristics.

Figure 1:
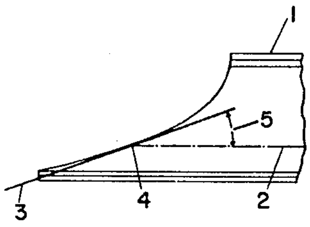
FIG. 1 is a highly magnified view of the peripheral surface of a semiconductor die element in accordance with the invention showing the highly acute angle between the plane of the rectifying junction represented by the dot-dash line and a plane tangent to the die surface at the junction.

FIG. 1 is a highly magnified view of the peripheral surface of a rectifier die in accordance with the invention, and this view clearly shows the highly acute angle 5 between the plane of the diffused rectifying junction 2 and a plane 3 tangent to the peripheral die surface at the point 4 where the diffused junction is exposed. Preferably this angle is less than 50° and satisfactory results have been obtained with a surface angle 5 in the range from about 25° to 30°.

Figure 2:
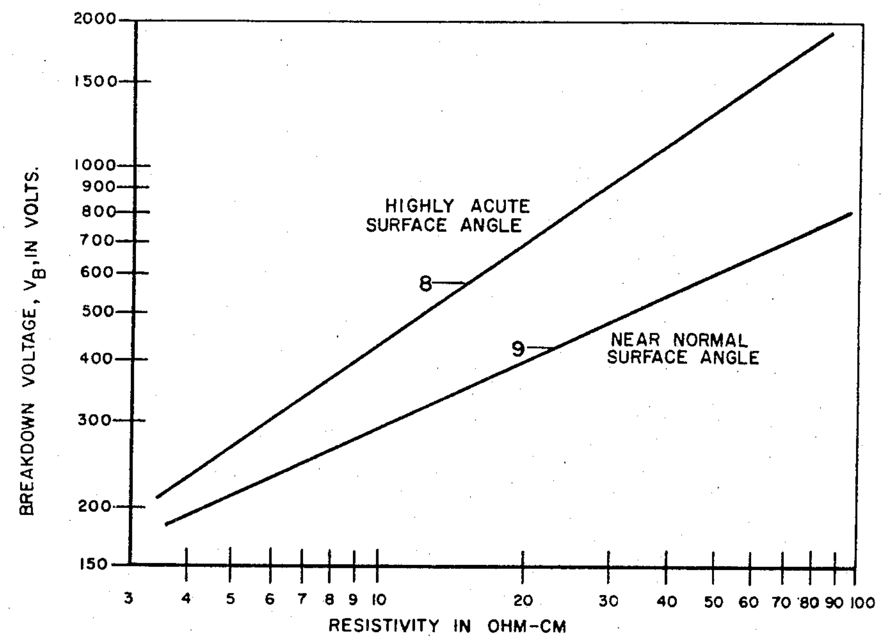
FIG. 2 is a graph of breakdown voltage versus resistivity of the semiconductor material for dice whose surface is nearly perpendicular to the junction as compared with dice as illustrated in FIG. 1 wherein the angle between the die surface and the rectifying junction is highly acute.

FIG. 2 is a plot which clearly shows the advantage of the highly acute surface angle die configuration shown in FIG. 1 over dice in which the junction intersects the die surface at nearly a right angle. In this figure the typical breakdown voltage realized is plotted on the ordinate, and the resistivity of the silicon material is plotted on the abscissa. The distribution of reverse breakdown voltages for the highly acute surface angle configuration is shown by line 8 in FIG. 2 and this should be compared with the distribution of breakdown voltages exhibited by the near normal surface angle configuration shown as line 9. The various resistivities shown along the abscissa represent typical resistivities which might be employed to make a variety of rectifier devices. It can be seen in FIG. 2 that at the lower resistivities the ratio of the highly acute surface angle breakdowns to the near normal surface angle breakdowns is considerably less than 2 to 1, while in the higher resistivity regions of 20 ohm-cm. and above, the ratio of the highly acute surface angle breakdowns to the near normal surface angle breakdowns is 2 to 1 or greater. The usual resistivities employed for making the high voltage silicon rectifier devices is in the range of 60 ohm-cm. resistivity and above. Therefore, the improvement in breakdown voltage provided by the highly acute surface angle configuration over the near normal surface angle configuration is of greatest advantage in higher voltage rectifier devices. A theoretical explanation in support of this improvement will be presented in order to provide a fuller understanding of the invention.

When a reverse bias is applied to a die 1 as shown in FIG. 1, a space charge depletion region is established on each side of the PN junction 2. It is an inherent characteristic of PN junctions that the entire reverse voltage is distributed over a relatively small distance on either side of the junction. The voltage distribution coincides with the region over which the voltage is distributed. The fact that the entire reverse voltage appears across a relatively short distance means that a very great electrostatic field exists over this distance. Experiments have shown that the breakdown of junctions having configurations of the type described herein is due largely to surface effects. Since the diffused junction is exposed all around the die periphery, this exposed region critically affects breakdown. In situations where the plane of the surface at the junction intersects the plane of the junction at near normal surface angles, the field existent along the surface on either side of the junction is very high since its location and gradient is determined by the space charge region. In dice having the configuration shown in FIGS. 1 and 3, the depletion region area appearing along the die surface on either side of the junction is stretched. The degree of stretching out is directly proportional to the reciprocal of the trigonometric sine of angle 5 of FIG. 1. This spreading out effect results in a proportionate spreading out of the electrostatic field at the surface. This reduces the voltage gradient existing along the surface near the point 4 of FIG. 1. This effect in turn increases the reverse voltage that can be applied before the junction will break down.

Figure 3:
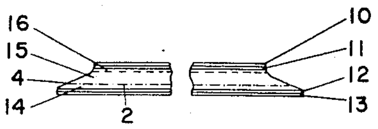
FIG. 3 is a magnified view of a semiconductor die element showing each region of different conductivity and indicating the rectifying junction in the die and the plated coatings on the upper and lower faces of the die.

FIG. 3 shows a magnified view of a complete semiconductor die element suitable for use in a high voltage rectifier. The central portion of the die is broken away in this view because of the difficulty of drawing such an enlarged view to scale. The basic material 15 of the semiconductor die element in this instance is silicon. The major upper and lower faces of the die have nickel plated inner layers 11 and 12 and have outer layers of gold plating 10 and 13. The gold material is readily solderable, and the nickel material provides satisfactory adherence of the plated coatings to the silicon. Region 15 is the basic N type silicon material. The diffused junction is located at 2. There is a diffused P+ type region at 14 and a diffused N+ type region at 16, and both of these regions are formed by diffusion methods which are not a part of the invention. The P+ region may be formed by diffusing acceptor impurity material such as boron into the original N type material, and the N+ region may be formed by diffusing donor type impurity material such as phosphorous into the original N type material. The region 16 is of greater electrical conductivity than the N type region 15 and is identified therefore as N+. The die is typically about 8 to 12 mils thick and has a diameter of the order of 70 to 125 mils.

Figures 4, 5, 7:
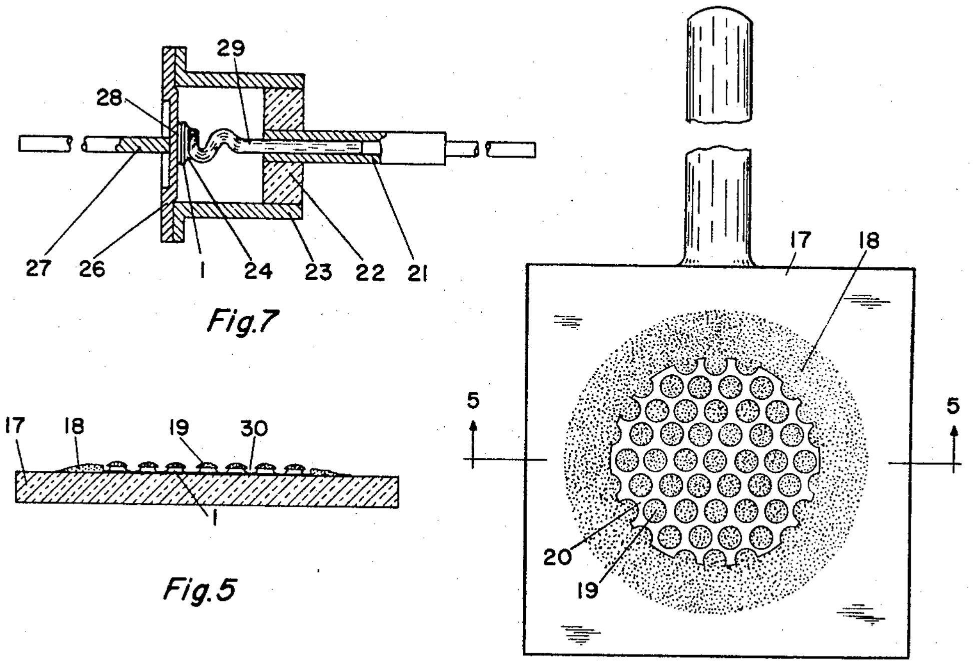
FIG. 4 shows a masked semiconductor wafer mounted in position on a paddle ready for the etching operation which forms the dice of the type shown in FIGS. 1 and 3.
FIG. 5 is a sectional view of FIG. 4 showing clearly the masked areas and the parts of the wafer that are removed during the etching operation.
FIG. 7 is a sectional view of a typical semiconductor high voltage rectifier showing the location of the semiconductor die element within the rectifier housing.
Figure 6:
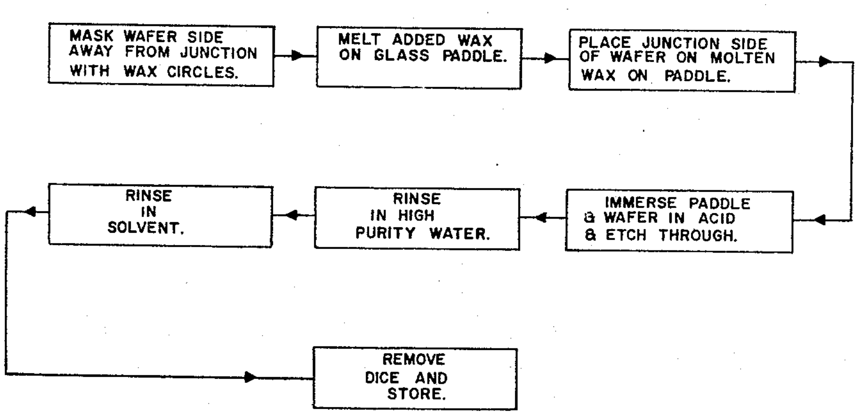
FIG. 6 is a process flow diagram showing the processing steps which are directly associated with forming the dice.

FIG. 6 is a process flow diagram which presents the important steps of the method of forming of the type dice shown in FIGS. 1 and 3. This method will now be presented in detail. A silicon wafer 20 having gold plated faces 10 and 13 (FIG. 4) is clamped within a metallic mask having a continuous pattern of holes on one side whose diameter is approximately one hundred thousandths of an inch. After the wafer is properly secured within the mask, acid resistant wax is sprayed through the holes in the mask causing wax circles 19 to be imprinted on one face of the wafer. It is very important that the wax circles appear on the face of the wafer farthest away from the PN junction 2, since it is desired to etch from this side. This method permits the attainment of the highly acute surface angle in the diffused junction region as previously mentioned. A glass paddle 17 shown in FIG. 4 is placed on a hot plate and additional wax 18 is melted on the surface of the paddle. When this wax 18 is completely melted into a puddle, the wafer 20 is placed in position on the molten wax with the junction side facing the paddle. The glass paddle 17 with the wafer 20 mounted on it is then removed from the hot plate and the wax is permitted to solidify. This secures the wafer to the paddle 17.

The paddle 17 with the wafer 20 mounted on it is then immersed in an aqua regia etching solution which removes the gold plating on the exposed wafer face. The paddle and wafer are rinsed in high purity water, and the assembly is then immersed in a hydrofluoric-nitric-acetic acid solution whwich cuts through the silicon material. A typical region which is etched away is shown at 30 in FIG. 5. This etching continues until the gold plating 13 becomes visible at the lower wafer face. The assembly is then rinsed in high purity water and is then immersed again in aqua regia to remove the lower face gold plating 13. The assembly is again rinsed in high purity water and is finally etched in a hydrofluoric-nitric acid solution. Another rinsing is then performed in high purity water and finally the assembly is rinsed in an ultrasonically agitated solvent bath. This causes the dice to separate from the assembly. The dice are then dried and stored.

FIG. 5 shows quite clearly, in a sectional view, the regions 30 on which the various acid baths operate to cut through the upper layer of gold plating, the silicon and also the bottom layer of gold plating. The condition of the die units shown in FIG. 5 is the condition that exists following the final aqua regia etching and prior to the solvent rinsing step. Since the etching progresses through the wafer from the side away from the rectifying junction, the etching produces dice with a tapered surface as shown in FIGS. 1 and 3 wherein the surface angle at the junction is highly acute.

FIG. 7 is a sectional view of a complete high voltage rectifier showing the die 1 located in its usual position mounted on the heat sink 26. This rectifier package is shown merely as one of many suitable packages for the die of the invention. The die 1 has been soldered in position on the heat sink by the solder layer 28 and the die's upper face has been secured to the S bend lead 29 by means of solder layer 24. The S bend lead 29 extends through, and is welded to the tube 21. The tube 21 is an integral part of the header 23 and is held in place by the glass region 22. The electrical lead 27 is welded to the heat sink 26 and provides the electrical contact to one side of die 1 through the heat sink and the soldered layer 28.

The particular rectifier die configuration described above results in unusually high reverse breakdown voltage characteristics as demonstrated by the data plotted in FIG. 2. The importance of the reduced electrostatic stress at the surface of the die in the region of the junction has been emphasized. When the angle of intersection between the plane of the junction and a plane tangent to the peripheral surface of the die at the junction is quite acute, the depletion layer which is produced in the electrical operation of the die as a rectifier spreads along a longer surface than when the junction is substantially perpendicular to the surface. This reduces the voltage gradient along the surface and since the effective surface field is thus weakened, there is less tendency for the junction to break down due to adverse effects of the surface field at the junction. Thus, higher reverse voltages can be applied to the die without causing the junction to break down.

The ability to use a single die in a high voltage rectifier is important because the amount of heat generated within the rectifier package is less when it has a single die than when it has more than one die. Also, heat is readily transferred from a single die to a heat sink. Where more than one die is required, a smaller number of dice may be used in a given application and this reduces the adverse effect of disproportionate voltage drops which may be produced across multiple die immediately after application of a reverse voltage. Also, material costs and assembly costs may be reduced and the assembly operation is simplified. Dice produced by other methods do not result in as favorable an angle of intersection of the die surface with the plane of the junction and therefore have inherently lower breakdowns. Since the voltage breakdown characteristics of a die are affected strongly by surface conditions at the junction, the voltage gradient at the surface of the die near the junction is a major contributing factor in the breakdown phenomenon. Thus, the advantage of the particular die configuration and etching method of the invention can be readily seen.

I claim:

1. A rectifying semiconductor element adapted for use in high voltage rectifying devices, comprising a thin body of semiconductor material having two oppositely disposed outside surfaces with two regions of opposite conductivity therein and having a rectifying junction between the two regions and farther away from one outside surface of the element than from the other outside surface thereof, the region adjacent said one surface being N type material, a peripheral surface which flares outwardly and uniformly around said regions from said one outside surface of said element to the other outside surface thereof and has the rectifying the junction exposed at said peripheral surface and entirely around the same, with said peripheral surface having a greater slope with respect to said one surface in the region adjacent said other outside surface of said element than in the region adjacent said one outside surface thereof, said rectifying junction intersecting said peripheral surface at a region of greater slope such that an acute angle formed between the plane of the junction between said regions and a reference plane extending from said one surface to the junction-peripheral plane intersection and tangent to said peripheral surface at said junction is less than fifty degrees, with said tapered peripheral surface serving to limit the effect of surface fields produced at said junction in the electrical operation of said semiconductor element and enhancing the reverse voltage characteristics of said element.

2. A rectifying semiconductor element adapted for use in high voltage rectifying devices, comprising a thin body of semiconductor material with two oppositely disposed outside surfaces, two regions of opposite conductivity within the body and a rectifying junction therein between the two regions and being farther away from one outside surface of the element than from the other outside surface thereof with the region adjacent said one surface being formed of N type material, a peripheral surface which flares uniformly outwardly from said one outside surface of said element and toward said other outside surface thereof and was produced coincident with etch-cutting the element out of a larger wafer with an etchant comprised of hydrofluoric-nitric-acetic acid, said peripheral surface having a greater slope with respect to a plane coincident with said junction inside the element in the region adjacent said one outside surface of said element than in the region adjacent said other outside surface, said rectifying junction intersecting said tapered peripheral surface of said semiconductor element along said peripheral surface at the region of less slope wherein an acute angle formed between the plane of the junction inside the element and a reference plane tangent to said tapered peripheral surface at said junction and extending from said one surface is less than fifty degrees, with said tapered peripheral surface serving to limit the effect of surface fields produced at said junction in the electrical operation of said semiconductor element and enhancing the voltage breakdown characteristics of said element.

3. A rectifying semiconductor silicon element adapted for use in high voltage rectifying devices having a voltage breakdown factor in excess of 1000 volts, comprising a thin body of semiconductor material with two oppositely disposed outside surfaces, two regions of opposite conductivity type within the body, a rectifying junction therein between the two regions which is farther away from one outside surface of the element than from the other outside surface thereof, a peripheral surface around the entire element which uniformly tapers outwardly from said one outside surface toward said other outside surface thereof which tapered surface was produced coincident with etch-cutting the semiconductor element out of a silicon wafer by etching through the wafer from said one ouside surface through a first region of N type material thence a second region of P type material to said other outside surface with an etching fluid consisting of hydrofluoric-nitric-acetic acid, and which tapered surface was also exposed to a fluid of hydrofluoric-nitric acid for finishing the same, said peripheral surface having a greater slope in the region adjacent said other outside surface of said element than in the region adjacent said one outside surface thereof, said rectifying junction intersecting said tapered peripheral surface of said semiconductor element at the region of greater slope wherein the acute angle formed between the plane of the junction and a reference plane tangent to said tapered peripheral surface at said junction is less than fifty degrees, with said tapered peripheral surface serving to limit the effect of surface fields produced at said junction in the electrical operation of said semiconductor element and enhancing the voltage breakdown characteristic of said element to one in excess of 1000 volts.

4. A semiconductor rectifying structure, including in combination, semiconductor means having two flat cylindrical regions respectively formed of opposite types of conductivity materials and having a rectifying junction therebetween and a peripheral surface smoothly extending about said regions, said junction terminating along said surface, one region being substantially thicker than another region and formed of N type semiconductor material, said peripheral surface being smoothly and uniformly curved from a minimum peripheral length about said one region remote from said junction termination to a maximum peripheral length about said another region, such smooth curve having a slope of greater than 50° with respect to said junction adjacent said minimum peripheral length and curving to a slope angle of not greater than 50° adjacent and across said junction termination with respect to a plane coincident with said junction and said angle lying within said structure and opening into said one region.

5. A semiconductor structure having a high resistivity body region of first conductivity-type semiconductive material, a layer of low resistivity semiconductive material on said body region and of a second conductivity-type semiconductive material forming a plane-shaped rectifying junction between said body region and the layer, said body and layer having a peripheral edge smoothly extending continuously therearound with said rectifying junction terminating continuously along said edge, said edge having an annular peripheral edge portion smoothly extending between said body region and said layer and everywhere across said continuous junction termination, and said portion everywhere being at an acute angle with respect to the plane-shaped rectifying junction and that opens into said body portion and the angle having an apex at the intersection of said plane-shaped rectifying junction and said annular portion with said acute angle extending continuously around the structure.

6. The structure of claim 5 wherein said angle is less than 50°.

7. The structure of claim 6 wherein said body region is N type silicon material and said layer consists of P type silicon material.

8. The structure of claim 7 wherein the N type body region has a resistivity of about 60 ohms-cm.

9. The combination of claim 7 wherein the N type resistivity is greater than 20 ohm-cm.

10. The combination of claim 5 wherein said acute angle is not greater than 30°.

11. The combination of claim 6 wherein said body region and said layer are circular in configuration and said peripheral edge around said body region and layer smoothly and uniformly extends from a minimum peripheral length around said layer toward a maximum peripheral length around said body region with said rectifying junction terminating at said edge between said minimum and maximum peripheral lengths.

12. A semiconductor device of the kind having a silicon wafer which incorporates a first layer of N-type conductivity which is contiguous with a second layer of P-type conductivity thereby forming a PN junction, said junction substantially coinciding with a cross-section of the wafer in a plane parallel to the main faces of the wafer, in which the net significant impurity concentration in said N-type layer is less than in said P-type layer, and the lateral surface of the wafer having a bevel completely around the periphery of the wafer at least in the region where said PN junction meets said surface, said bevel defining completely around the periphery of the wafer an included angle of less than 60° between the plane of said PN junction and the lateral surface of said N-type layer contiguous with said junction.

13. A semiconductor device according to claim 12 in which the P-type layer is contiguous with the whole of one main face of the wafer, and the device includes an electrode which is in good electrical connection with a major portion of said one main face.

14. The semiconductor device of claim 13 wherein said P-type layer is coextensive with one main face and said bevel extends to said one main face continuously around the device.

15. A high voltage semiconductor structure having first and second regions of opposite conductivity-type semiconductor-type materials with a peripheral surface extending around said regions and a rectifying junction between said regions intersecting said peripheral surface continuously around said regions, the improvement including in combination, said peripheral surface including a surface portion extending completely around said junction termination and everywhere disposed at an acute angle with respect to said junction with such angle opening into said first region and said surface portion extending over said regions away from said junction intersection, and said first region having a higher resistivity than said second region.

16. The structure of claim 15 wherein said peripheral surface along said surface portion has a circular configuration around said regions and said surface portion extends smoothly along said junction intersection such that said angle is uniform therealong.

References Cited

UNITED STATES PATENTS

| | | | |
|---|---|---|---|
| 2,395,743 | 2/1946 | Kannenberg et al. | 317—234 |
| 2,794,846 | 6/1957 | Fuller | 317—234 |
| 2,993,155 | 7/1961 | Gotzberger | 317—242 |
| 3,007,090 | 10/1961 | Rutz | 317—235 |
| 3,255,055 | 6/1966 | Ross | 148—186 |

FOREIGN PATENTS

| | | |
|---|---|---|
| 1,228,285 | 8/1960 | France. |
| 883,468 | 11/1961 | Great Britain. |

JAMES D. KALLAM, *Primary Examiner.*